United States Patent [19]

Yamano et al.

[11] Patent Number: 5,122,503
[45] Date of Patent: Jun. 16, 1992

[54] SUPERCONDUCTING MATERIAL AND METHOD OF PRODUCING SAME

[75] Inventors: Masaru Yamano, Hirakata; Atsuo Mizukami, Kasiwa; Masao Nakao, Tsukuba; Shingo Terakado, Tsukuba; Ryohkan Yuasa, Tsukuba; Masaaki Nemoto, Tsukuba; Hiromi Mukaida, Tsukuba; Kazuaki Shikiti, Tsukuba, all of Japan

[73] Assignee: Sanyo Electric Co., Ltd., Osaka, Japan

[21] Appl. No.: 684,463

[22] Filed: Apr. 9, 1991

Related U.S. Application Data

[63] Continuation of Ser. No. 541,478, Jun. 22, 1990, abandoned, which is a continuation of Ser. No. 166,120, Mar. 10, 1988, abandoned.

[30] Foreign Application Priority Data

| Mar. 13, 1987 | [JP] | Japan | 62-59158 |
| Mar. 27, 1987 | [JP] | Japan | 62-75373 |
| Mar. 27, 1987 | [JP] | Japan | 62-75375 |
| Apr. 9, 1987 | [JP] | Japan | 62-87688 |
| Apr. 10, 1987 | [JP] | Japan | 62-89031 |
| Apr. 20, 1987 | [JP] | Japan | 62-96469 |
| Apr. 22, 1987 | [JP] | Japan | 62-99579 |
| Apr. 24, 1987 | [JP] | Japan | 62-102689 |
| Apr. 30, 1987 | [JP] | Japan | 62-107503 |
| Apr. 30, 1987 | [JP] | Japan | 62-107504 |
| May 13, 1987 | [JP] | Japan | 62-116201 |
| May 13, 1987 | [JP] | Japan | 62-116202 |
| May 13, 1987 | [JP] | Japan | 62-116203 |

[51] Int. Cl.$^5$ .......... C01B 13/14; C01F 11/02; C01G 3/02; H01L 39/12
[52] U.S. Cl. .......... 505/1; 252/518; 252/521; 501/123; 501/152; 505/725; 505/739; 505/742; 505/780
[58] Field of Search .......... 505/1, 725, 739, 742, 505/780; 252/518, 521; 501/123, 152; 423/604, 635

[56] References Cited

PUBLICATIONS

Cava, R. J., et al.: *Phys. Rev. Lett.*, 58 (No. 16), 20 Apr. 1987, pp. 1676–1679.
Engler, E. M. et al.: *J. Am. Chem. Soc.*, 109, pp. 2848–2849, 29 Apr. 1987.
Tapes 1 & 2 of the American Physical Society meeting in New York City, Mar. 18, 1987 (VHS Cassette).
Hirabayashi, M. et al.: *Jpn. J. Appl. Phys.*, 26, No. 4, Apr. 20, 1987, pp. L454–L455.
Kurihara, S., et al.: *Proceedings of Symposium S*, 1987 Spring Meeting of MRS, Apr. 23–24, 1987, Anaheim, Calif., pp. 145–148.
Preprint: Qadri, S. B., et al.: "X-Ray Identification ... in the Y—Ba—Cu—O System", Naval Research Lab, Washington, D.C., 5 Mar. '87.
Qudri, S. B., et al.: *Phys. Rev. B*, 35, No. 13, 1 May 1987, pp. 7235–7237.
Michel, C. et al., *Revue de Chimie Minerale*, 41, 1984, pp. 407–425.

*Primary Examiner*—Paul Lieberman
*Assistant Examiner*—John Boyd
*Attorney, Agent, or Firm*—Darby & Darby

[57] ABSTRACT

The present invention relates to a superconducting material that is, substances having compositions expressed by empirical formulae $Y_{1-x}Ba_xCuO_3$, $YBa_2Cu_3O_7$ and $LnBa_2Cu_3O_7$ and critical temperatures of 90 K. or more, and to a method of producing the same in which for example $Y_2O_3$, $BaCO_3$ and $CuO$ are blended at a mixture molar ratio of 1:2:6 and the resulting mixture is molded under pressure followed by slowly cooling in an oxidizing atmosphere.

17 Claims, 14 Drawing Sheets

SUPERCONDUCTING MATERIAL AND METHOD OF PRODUCING SAME

This is a continuation of application Ser. No. 07/541,478, filed Jun. 22, 1990, which is a continuation of prior application Ser. No. 07/166,120, filed Mar. 10, 1988.

BACKGROUND OF THE INVENTION

1. Field of the Invention

The present invention relates to a superconducting material having a critical temperature of 90 K. or more and a method of producing the same.

2. Description of the Prior Art

A superconductivity is a phenomenon in which a certain kind of electrically conductive substance shows an electrical resistance of zero when it is held at low temperatures near an absolute temperature of zero. $Nb_3Sn$ having a critical temperature of 18 K. has been known as a representative one. And, its applications in the following fields are thought.

(1) Lossfree transmission of electricity via a transmission line;

(2) Plasma-confining coil in a nuclear fusion;

(3) Coils for floating and propelling a linear motor car;

(4) Coils for propelling an electro-magnetically propelled ship;

(5) Coils for generating a magnetic field and detecting signals in the magnetic resonance imaging;

(6) Coil for regulating an orbit of particles of a beam line and a detector of reacted particles in a particle accelerator;

(7) Josephson's device for a superhigh speed computer: and (8) Fine magnetic detecting coil for a magnetic brain wave meter and a magneto-cardiograph.

However, in order to maintain the superconducting state it is necessary to maintain the substance at temperatures near an absolute temperature of zero and liquid He (having a boiling point of 4 K.) capable of achieving the above described requirement is expensive, so that the application of the superconducting material mentioned above is wanting in reality. Thus, the investigation and development of a substance showing a superconductivity at higher temperatures have been carried out. At the beginning of the 1970's $Nb_3Ge$ having a critical temperature of 23.9 K. was discovered. Thereafter, no developement has been obtained about 10 years but in April in 1986, IBM Corp. published that a compound comprising La, Ba and CuO has a critical temperature of 30 K. In addition, in December in 1986, University of Tokyo published a superconducting material having a critical temperature of 37 K., the Bell Institute of ATT published a superconducting material having a critical temperature of 40 K., and the Electrotechnical Laboratory in Japan published a superconducting material having a critical temperature of 54 K. in January in 1987. It is said that the last one is a compound comprising La, Sr and CuO. In order to maintain a substance having a critical temperature of such degree under the superconducting state liquid hydrogen (having a boiling temperature of 20 K.) and liquid neon (having a boiling point of 27 K.) can be used, and thereby, its application to various uses became realistic. However, in view of the economy, a substance capable of maintaining the superconducting state by cooling inexpensive liquid nitrogen (having a boiling point of 77 K.), that is, concretely speaking, a substance having a critical temperature of 90 K. or more, is required and its development and discovery have been expected.

SUMMARY OF THE INVENTION

A first object of this invention is to provide a superconducting material having a critical temperature capable of maintaining the superconducting state at a temperature of liquid nitrogen (77 K.) or more.

A second object of this invention is to provide a superconducting material difficult to be affected by a magnetic field.

Another object of this invention is to provide a superconducting material exhibiting a high current density.

A further object of this invention is to provide a method of producing the above described superconducting material by simple processes.

The first one of the above described superconducting material is $ABO_3$ in which the A site is (YBa) and the B site is Cu having a perovskite structure deformed from a cubic structure or a crystalline structure similar thereto. The second one of the above described superconducting material has a composition expressed by $LnBa_2Cu_3O_{7-\delta}$ and an orthorhombic perovskite structure or a crystalline structure similar thereto. Here, Ln is an element selected from a group consisting of Y, Yb, Er, Gd, Dy, Ho, Eu, Sm and Nd.

The composition of the above described first superconducting material and that of the above described second superconducting material were thought to be $ABO_3$ which has a standard cubic structure at the beginning but thereafter, it has been found that they have a triple period in a direction of c-axis of crystal. In addition, it has been found that Ln and Ba of the A site are regularly arranged. It has been also found from the investigation of places where oxygen is lost that a number of oxygen is "7" and the more detailed investigation has revealed that the number of oxygen is slightly less than 7. Accordingly, the number of oxygen is expressed by "$7-\delta$". It has been also found that when this "$\delta$" amount to about 0.5, the orthorhombic structure is not obtained but the tetragonal structure is obtained. That is to say, according to the present common opinion of academic circles, superconductive oxides have a composition expressed by $LnBa_2Cu_3O_{7-\delta}$.

Therefore, "$O_3$" of $Y_{1-x}Ba_xCuO_3$ and "$O_7$" of $YBa_2Cu_3O_7$ and $LnBa_2Cu_3O_7$ hereinafter means "$O_{3-\delta}$" and "$O_{7-\delta}$" respectively.

Besides, the above described superconducting material is produced by blending oxides of Ln, carbonates of Ba and oxides of Cu, molding the resulting mixture under pressure, sintering the molded product in an oxidizing atmosphere, and slowly cooling the sintered product, and superconducting material having different characteristics are obtained depending upon the cooling conditions.

The above and further objects and features of the invention will more fully be apparent from the following detailed description with accompanying drawings.

DESCRIPTION OF THE PREFERRED EMBODIMENTS

A superconducting material according to the present invention includes the following compounds.

(1) Compounds having a composition expressed by an empirical formula $Y_{1-x}Ba_xCuO_3$ ($0 < x < 1$) and a modified perovskite structure or a structure similar thereto.

For example, 0.6 is given as a value of x. In addition, they also include compounds comprising a plurality of phases in which at least one phase has a structure without being affected by a magnetic field.

(2) Compounds having a composition expressed by an empirical formula $YBa_2Cu_3O_7$. They include compounds formed of phases which are difficult to be affected by a magnetic field, and compounds through which the current is passed at a current density of 100 $A/cm^2$.

(3) Compounds having a composition expressed by an empirical formula $LnBa_2Cu_3O_7$ and an orthorhombic perovskite structure or a structure similar thereto. Yb, Er, Gd, Dy, Ho, Eu, Sm and Nd are given as the lanthanoids.

Next, a method of producing these substances will be explained.

At first, a method of producing the substances, in which x=0.6, in short, the substances expressed by the empirical formula $Y_{0.4}Ba_{0.6}CuO_3$ is described.

The first process [the process of blending and pulverizing war materials]

Powders of $Y_2O_3$, $BaCO_3$ and $CuO$ are blended at a molar ratio of 0.2:0.6:1 and stirred in a stirrer with an organic solvent, such as ethanol and methanol, added. Then, the organic solvent is evaporated and the residual is ground down into powder in a mortar. Industrially, other grinding means may be used.

The second process [the molding process]

Figure 1:
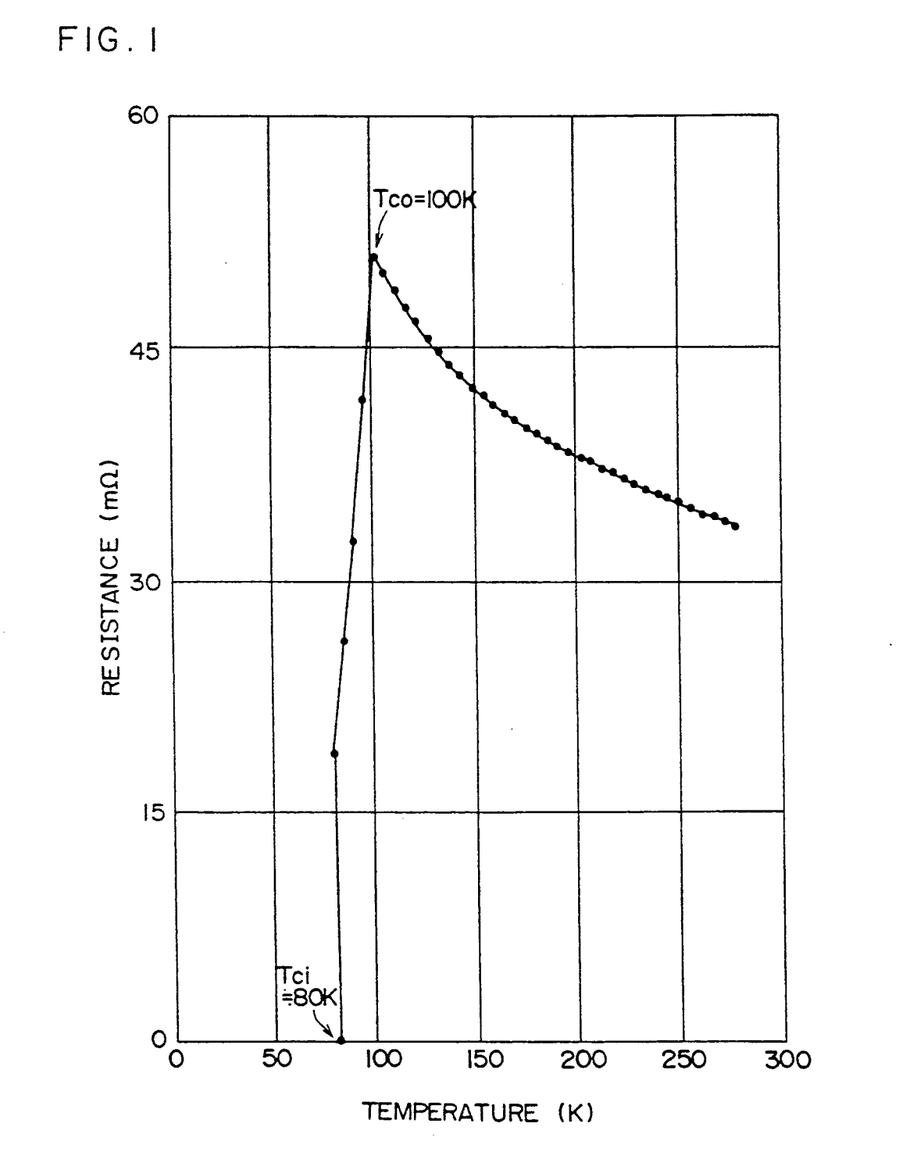
FIGS. 1 to 4 are graphs showing electric resistance-temperature characteristics of $Y_{1-x}Ba_xCuO_3$.

The above described powdery mixture is put in a molding machine and molded under pressure to obtain pellets. In the case where 1 g of the powdery mixture is used, it is appropriate to use a metallic mold of the molding machine which has a diameter of 17 mm. Every molding pressure is optionally used so far as it meets a value required for pelletizing the powdery mixture but 130 $kgf/cm^2$ was used for a first substance having characteristics shown in FIG. 1 and 750 $kgf/cm^2$ for second to fourth substances having characteristics shown in FIGS. 2 to 4.

The third process [the sintering and slowly cooling process]

The above described pellets are sintered for 30 to 10 hours at temperatures of 920° to 1,000° C. in an electric furnace or an infrared furnace and then slowly cooled. This process is different depending upon the first to fourth substances.

The first substance is sintered by heating for 30 minutes at 1,000° C. or heating for 10 hours at 950° C. in air.

The second substance is sintered by heating for 1 hour at 990° C. in an oxidizing atmosphere with flowing oxygen into the furnace and slowly cooled at a rate of 10° C. to 100° C./min., preferably 30° C./min.

The third substance is sintered by heating for 1 hour at 920° C. in air and slowly cooled at a rate of 10° C. to 100° C./hr, preferably 46° C./hr.

The similar results are obtained even though the third substance is sintered by heating in the oxidizing atmosphere in the same manner as for the second substance.

The fourth substance is sintered by heating for 1 hour at 1,000° C. in an oxidizing atmosphere with flowing oxygen into the furnace and slowly cooled at a rate of 7° C. to 15° C./hr, preferably 10° C./hr.

The condition of the oxidizing atmosphere are same as for the second substance.

Next, a method of producing the substances (2), that is, the substances having the composition expressed by the empirical formula $YBa_2Cu_3O_7$, is described.

Basically, a method of producing these substances is different from that of the substances (1) merely in that the mixture molar ratio of $Y_2O_3$, $BaCO_3$ and $CuO$ is different from that of the substances (1). The substances (2) are different from the substances (1) in nominal composition but the former is same as the latter in stoichiometric composition. That is to say, those powders are blended at a ratio of 1:4:6. The resulting powdery mixture is stirred in a stirrer with an organic solvent added. Then, the organic solvent is evaporated and the residual is ground down into powder in a mortar. Subsequently, the resulting powders are subjected to the pressing five times at a pressure of 750 $kgf/cm^2$ to obtain pellets of 20 mm long, 5 mm wide and 2 mm thick. These pellets are sintered by heating for 1 hour at 1,000° C. in an infrared furnace with flowing oxygen into the furnace at a rate of 2 liters/min. and slowly cooled in an oxygen atmosphere at a rate of 50° C./hr. A sintered product of 17 mm long, 4.5 mm wide and 1.8 mm thick is obtained.

Next, a method of producing the substances (3), that is, the substances having a composition expressed by the empirical formula (lanthanoid) $Ba_2Cu_3O_7$, is described.

Basically, this method is different from that for the substances (2) merely in raw material used. That is to say,

The first process [the process for blending and pulverizing raw materials]

Pulverized lanthanoid oxides, such as $Yb_2O_3$ and $Er_2O_3$, $BaCO_3$ and $CuO$ are blended at a mixture molar ratio of 1:4:6 and the resulting mixture is stirred in a stirrer with an organic solvent such as ethanol and methanol added. After the organic solvent is evaporated, the residual is ground down into powder in a mortar.

The second process [the molding process]

The resulting powders are put in a metallic mold and subjected to the pressing at a molding pressure of for example 750 $kgf/cm^2$ five times to obtain pellets for example of 20 mm long, 5 mm wide and 2 mm thick.

The third process [the sintering and slowly cooling process]

Yb is sintered by heating in a muffle furnace for 1 hour at 1,050° C. and others are sintered in an infrared furnace for 1 hour at 1,000° C. and then slowly cooled at a rate of 50° C./hr. Both the sintering and the slow cooling are carried out in air. In addition, in the case where $Er_2O_3$ is used, the pellets may be sintered by heating for about 1 hour at about 1,000° C. and about 3 hours at about 800° C. in an atmosphere of oxygen flowing at a rate of 2 liters/min. and then cooled at a rate of 150° C./hr. This leads to a reduction of time in comparison with the above-mentioned process.

Next, temperature characteristics of an electric resistance of the substances according to the present invention are described.

FIGS. 1 to 4 show characteristics of said first to fourth substances having a composition expressed by the empirical formula $Y_{0.4}Ba_{0.6}CuO_3$.

The superconducting critical temperature $T_{co}$ (an on-set temperature at which the electric resistance begins to descend) and the zero-resistance temperature $T_{ci}$ (a temperature at which the electric resistance completely becomes zero) are as follows (unit: K).

|  | $T_{co}$ | $T_{ci}$ |
| --- | --- | --- |
| The first substances | 100 | about 80 |
| The second substances | 100 | 81 |
| The third substances | 96 | 91 |
| The fourth substances | 93 | 91 |

Figure 2:
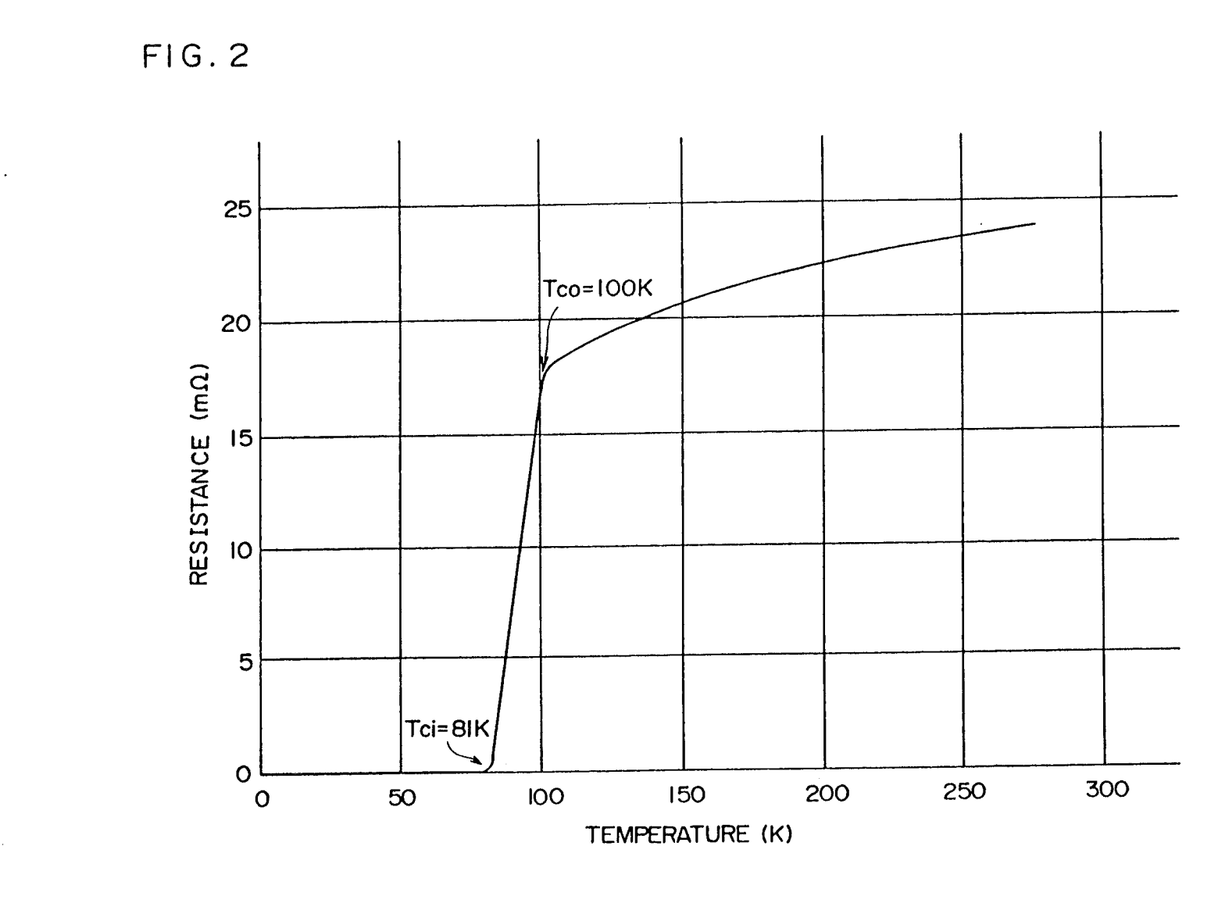
Figure 3:
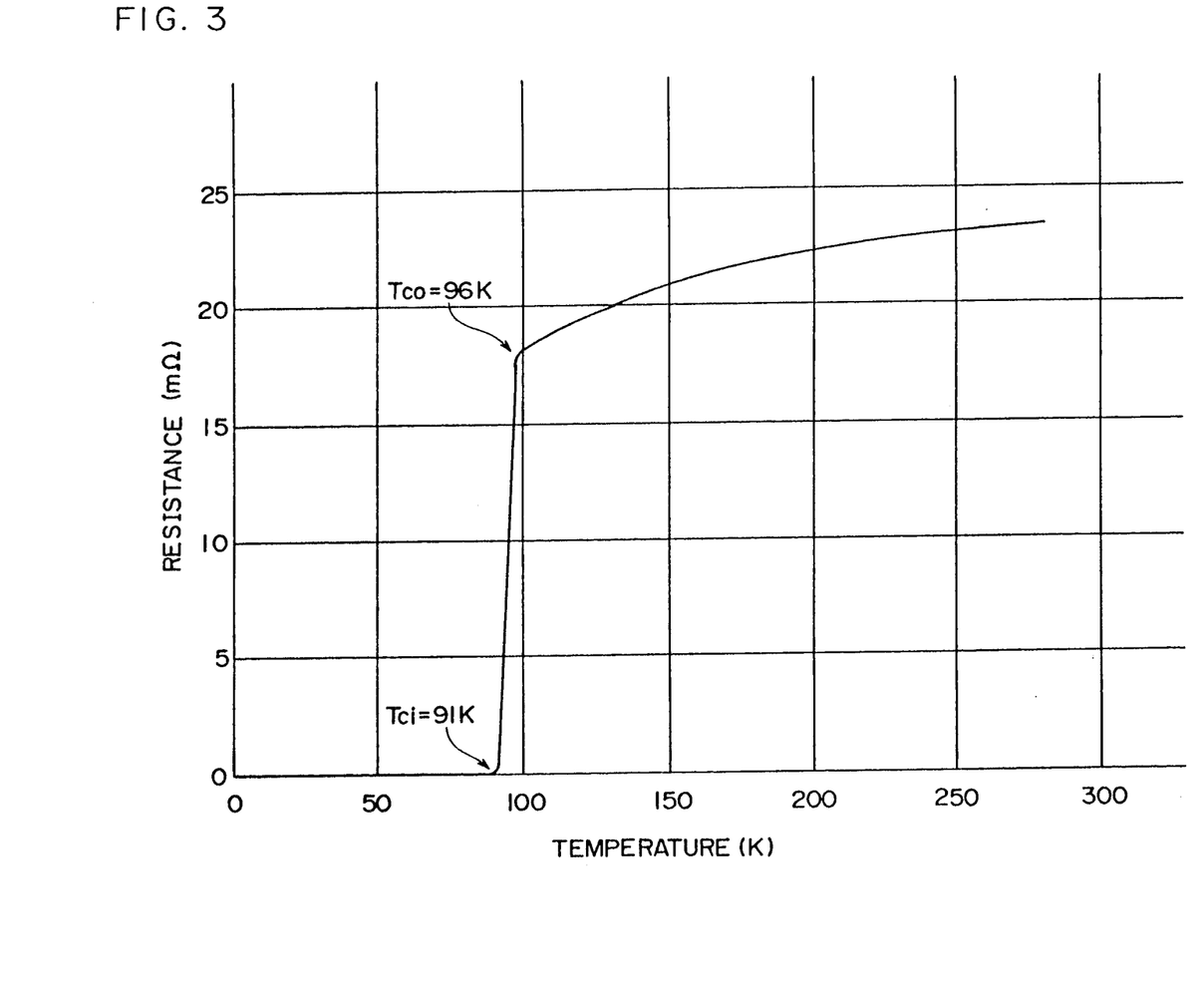

As obvious from a comparison of FIG. 2 for the second substances with FIG. 3 for the third substances, oxygen is appropriately taken in to heighten $T_{ci}$ when slow cooling speed is lowered.

Figure 4:
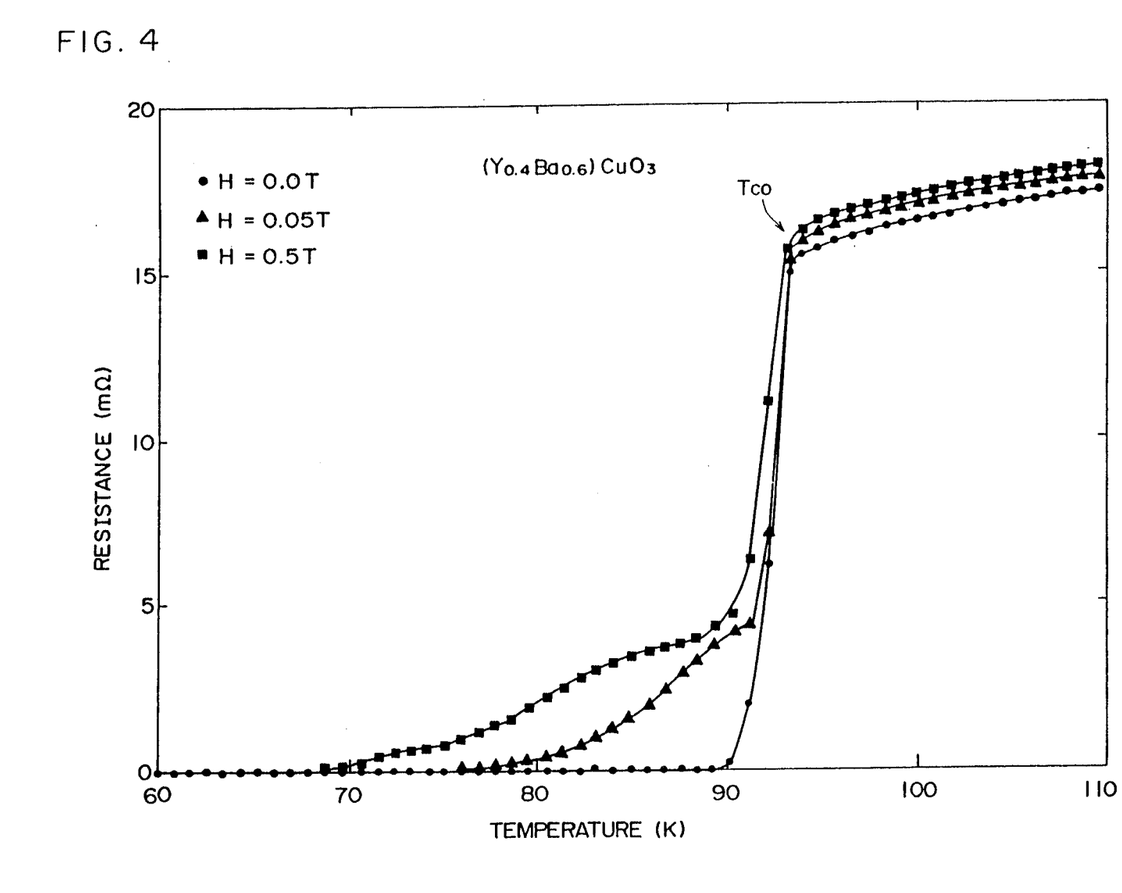

The characteristics for the fourth substances shown in FIG. 4 show the change for three different magnetic fields applied of 0. 0.05T and 0.5T. As obvious from this figure, $T_{co}$ is nearly constant regardless of the existence and values of the magnetic field. This suggests that the substances comprise a plurality of phases and have a structure in which at least one phase is difficult to be affected by the magnetic field.

In addition, it is found from the characteristics for the magnetic field of 0.5T shown in FIG. 4 that these superconducting materials are suitably used as a magnetic sensor.

Figure 5:
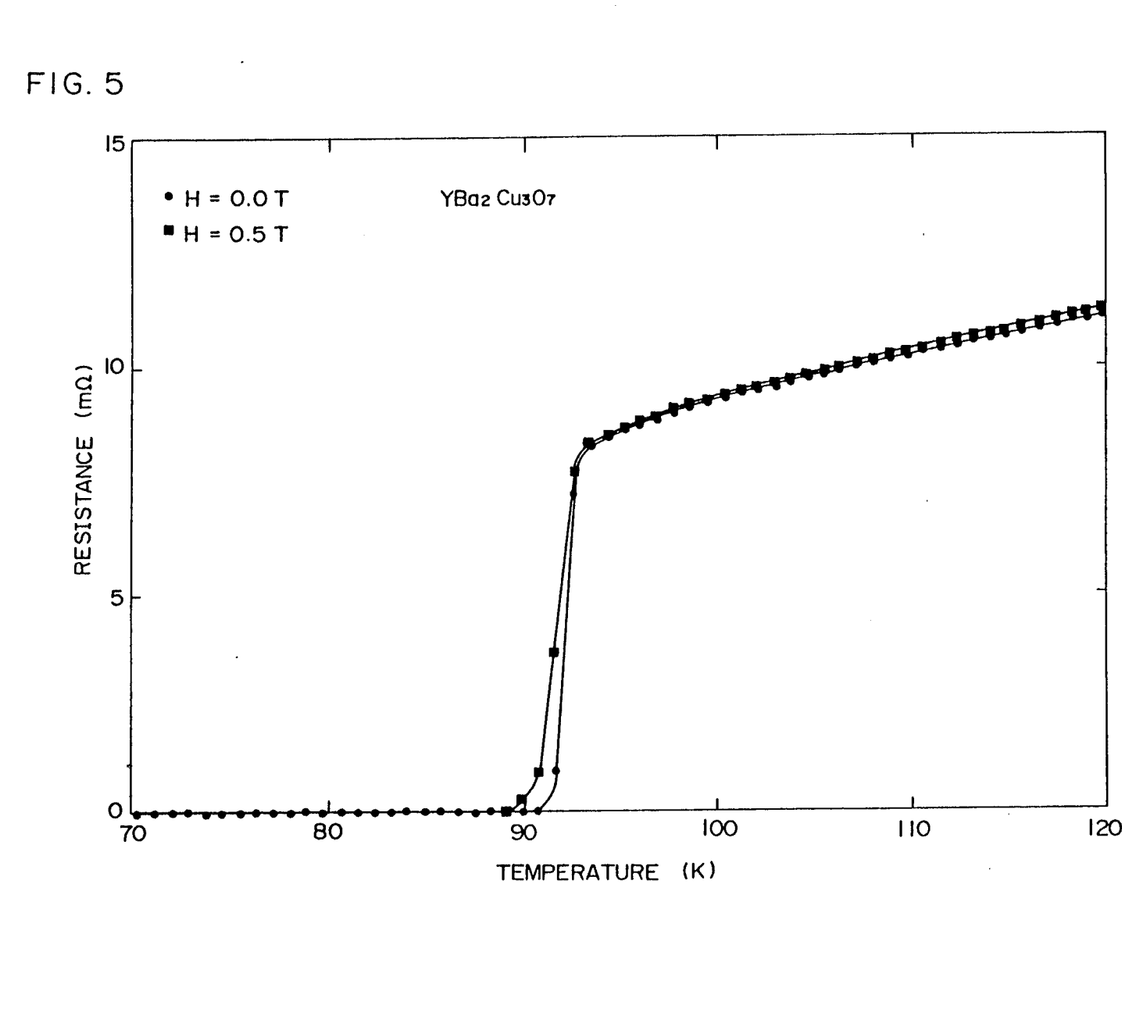
FIG. 5 is a graph showing electric resistance-temperature characteristics of $YBa_2Cu_3O_7$.

FIG. 5 shows a relation between an electric resistance and a temperature for $YBa_2Cu_3O_7$. $T_{co}$ of 96 K and $T_{ci}$ of 91 K are shown. Values in the case where the magnetic field applied of 0 and 0.5T are shown. As shown in this figure, the substances are formed of phases which are difficult to be affected by the magnetic field.

Figure 6:
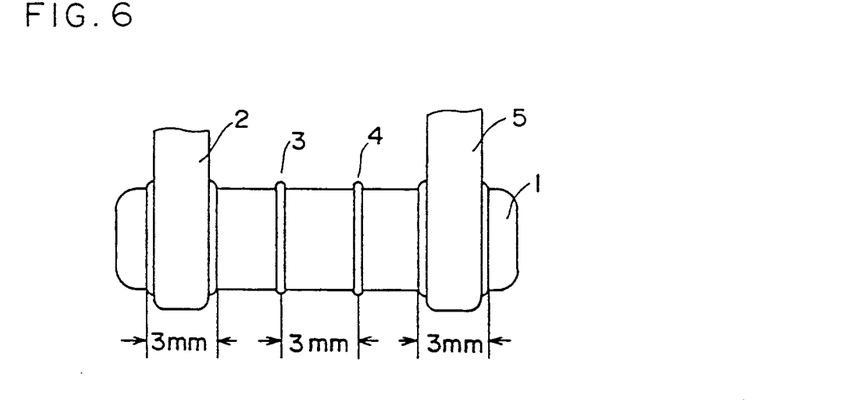
FIGS. 6, 7 is a plan view and a sectional view showing the installation of electrode terminals for measuring a critical current, respectively.
Figure 7:
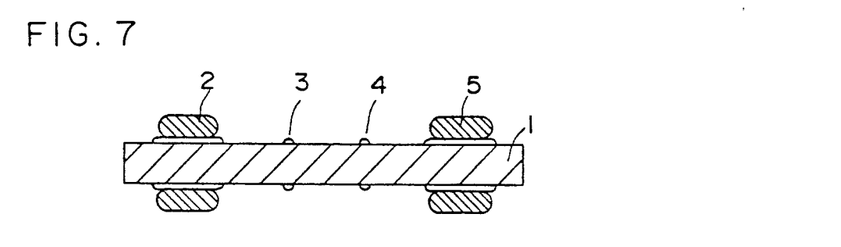
Figure 8:
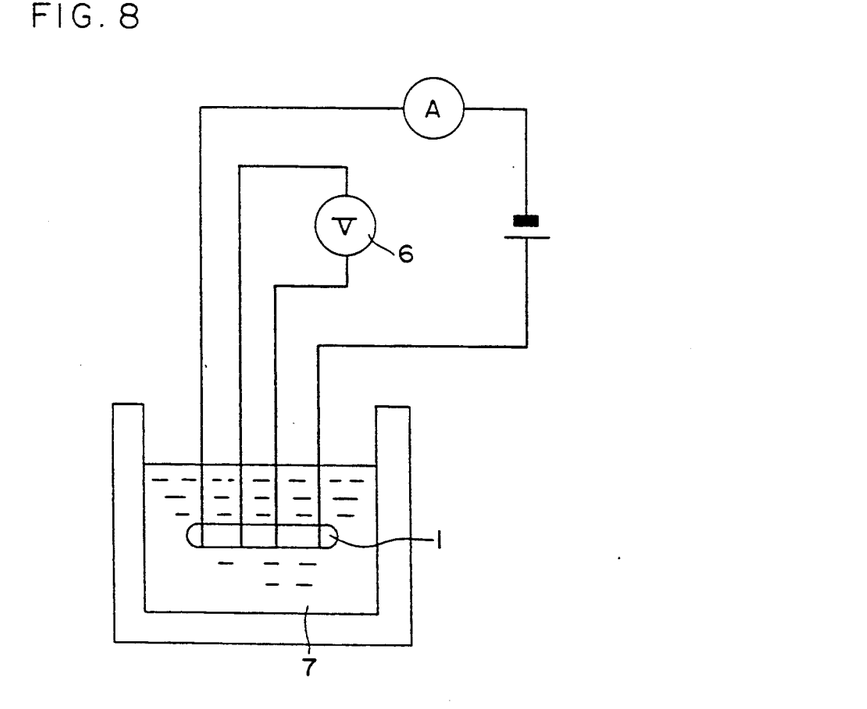
FIG. 8 is a schematic diagram showing an apparatus for measuring a critical current.
Figure 9:
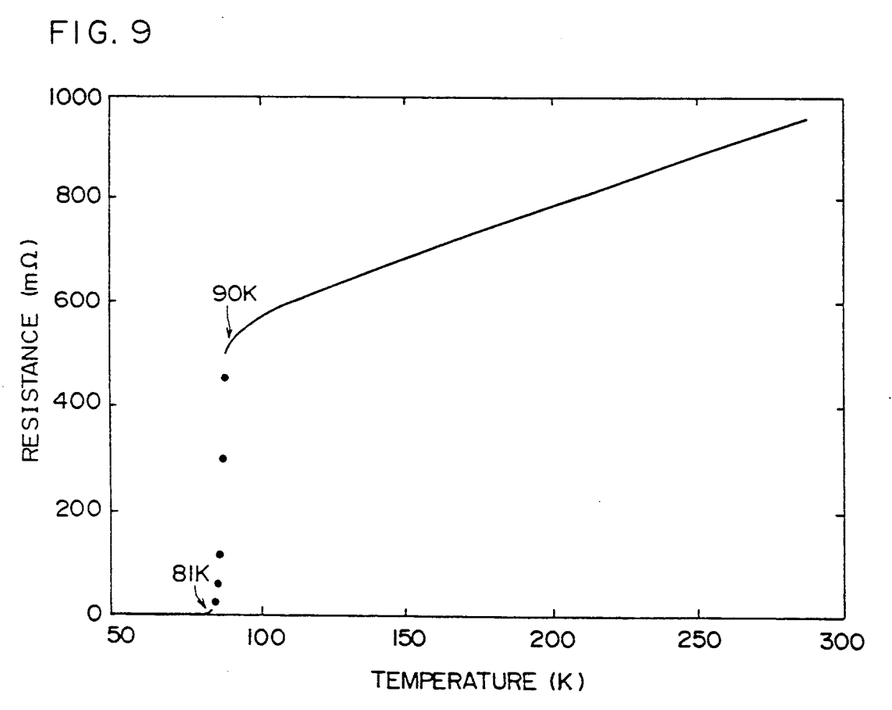
FIGS. 9 to 16 are graphs showing electric resistance-temperature characteristics of $YbBa_2Cu_3O_7$, $ErBa_2Cu_3O_7$, $GdBa_2Cu_3O_7$, $DyBa_2Cu_3O_7$, $HoBa_2Cu_3O_7$, $EuBa_2Cu_3O_7$, $SmBa_2Cu_3O_7$ and $NdBa_2Cu_3O_7$, respectively.
Figure 10:
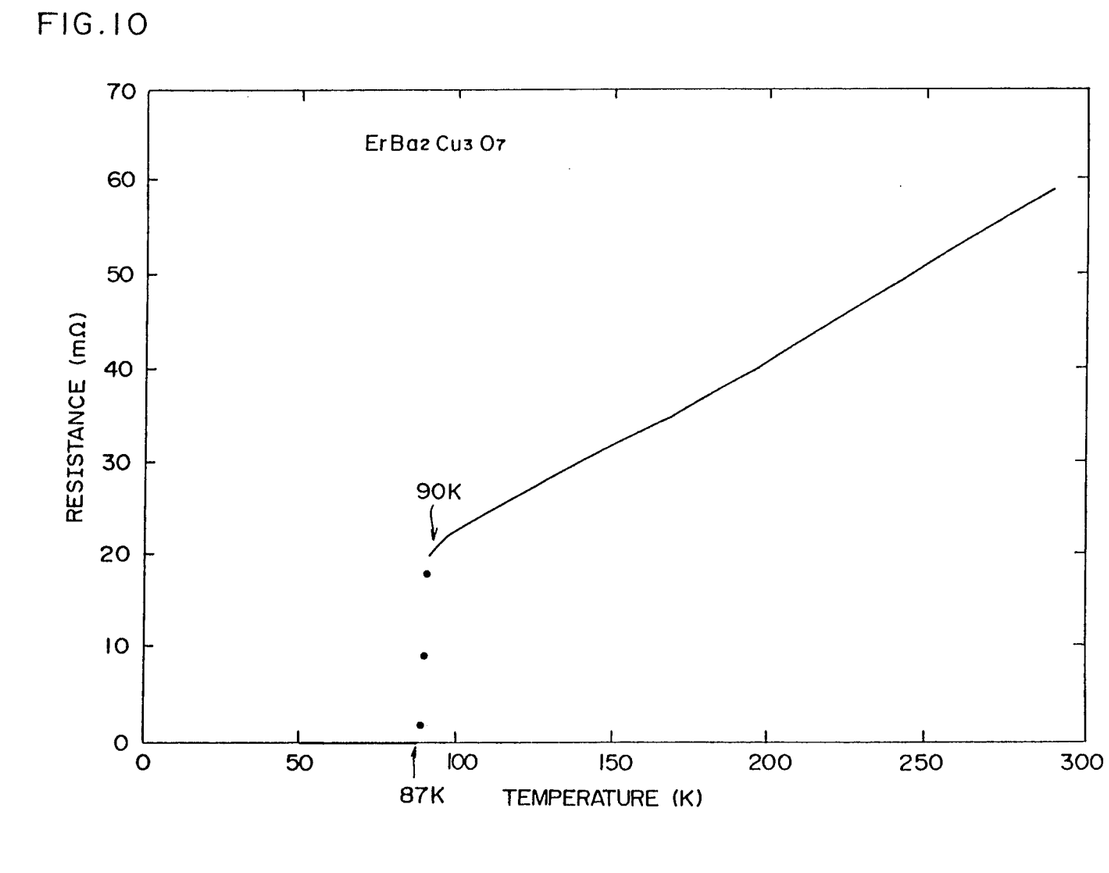
Figure 11:
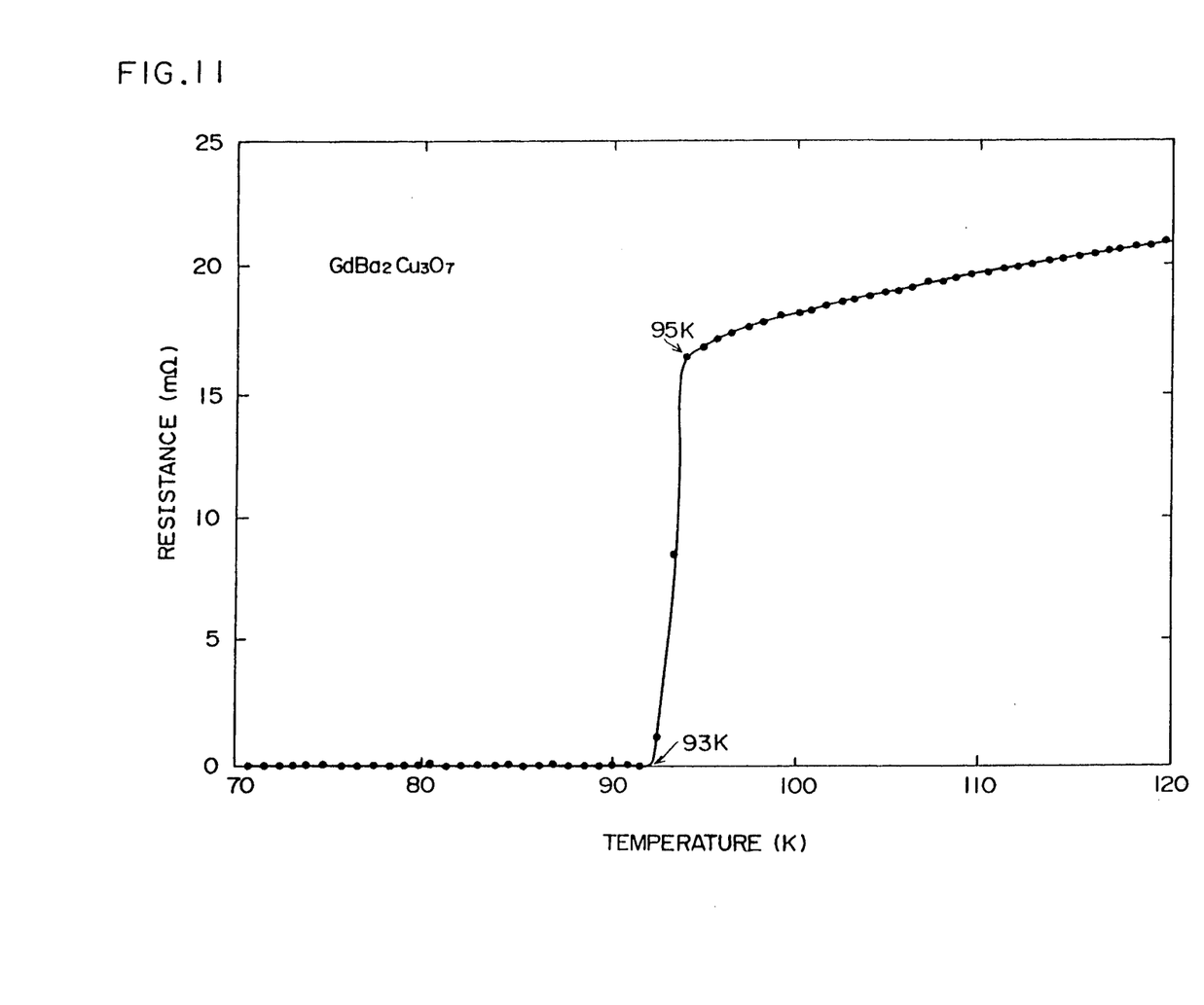
Figure 12:
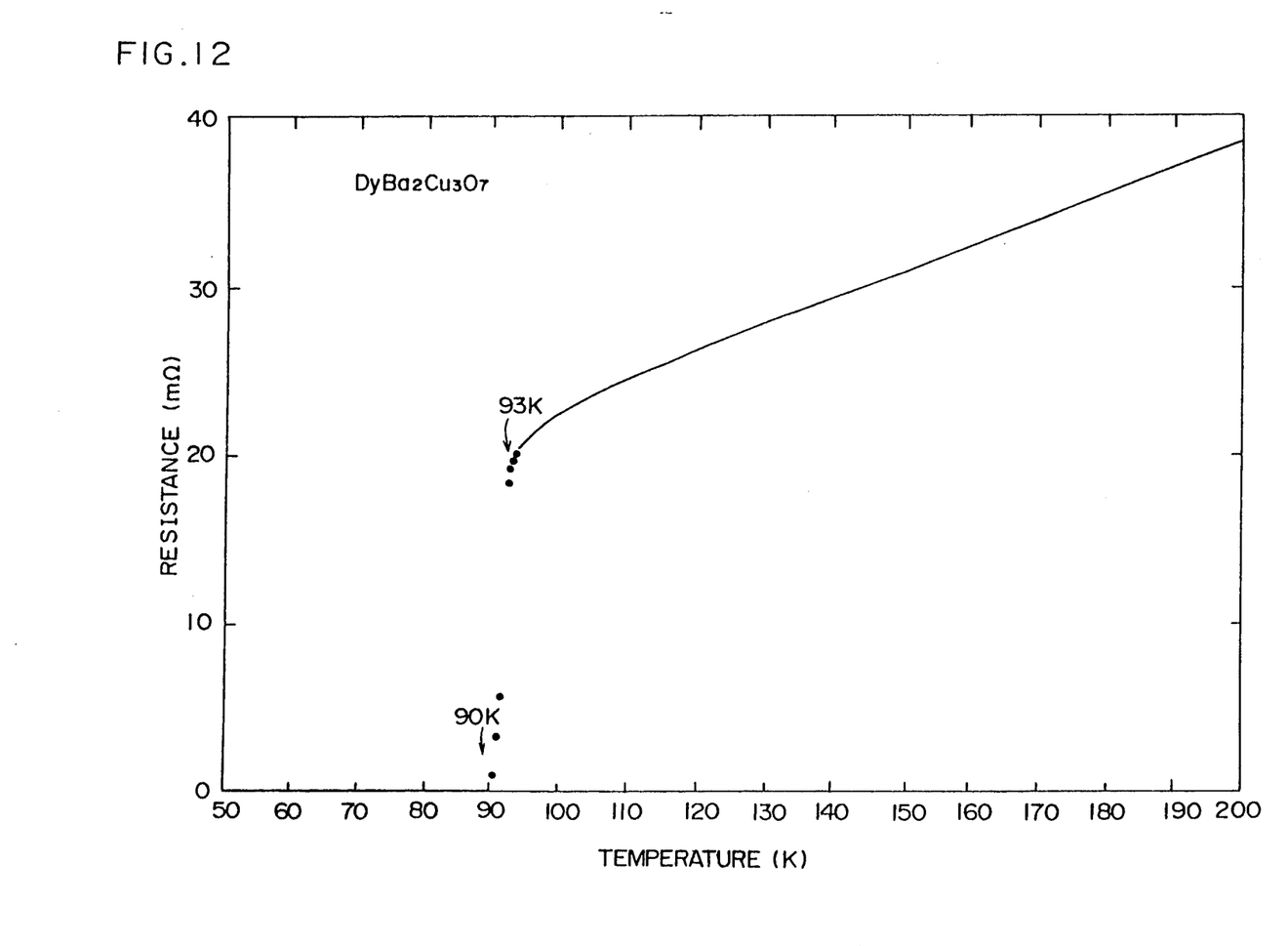
Figure 13:
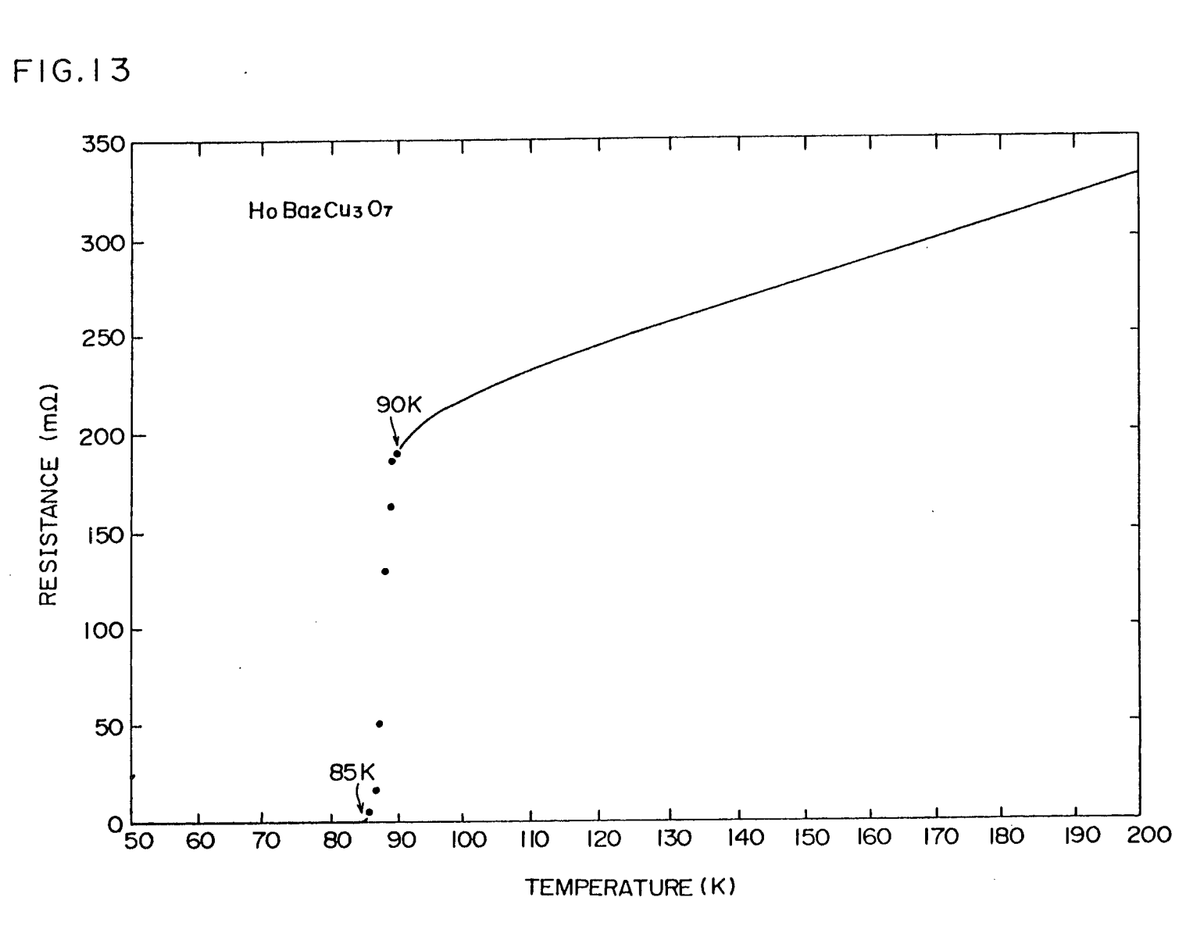
Figure 14:
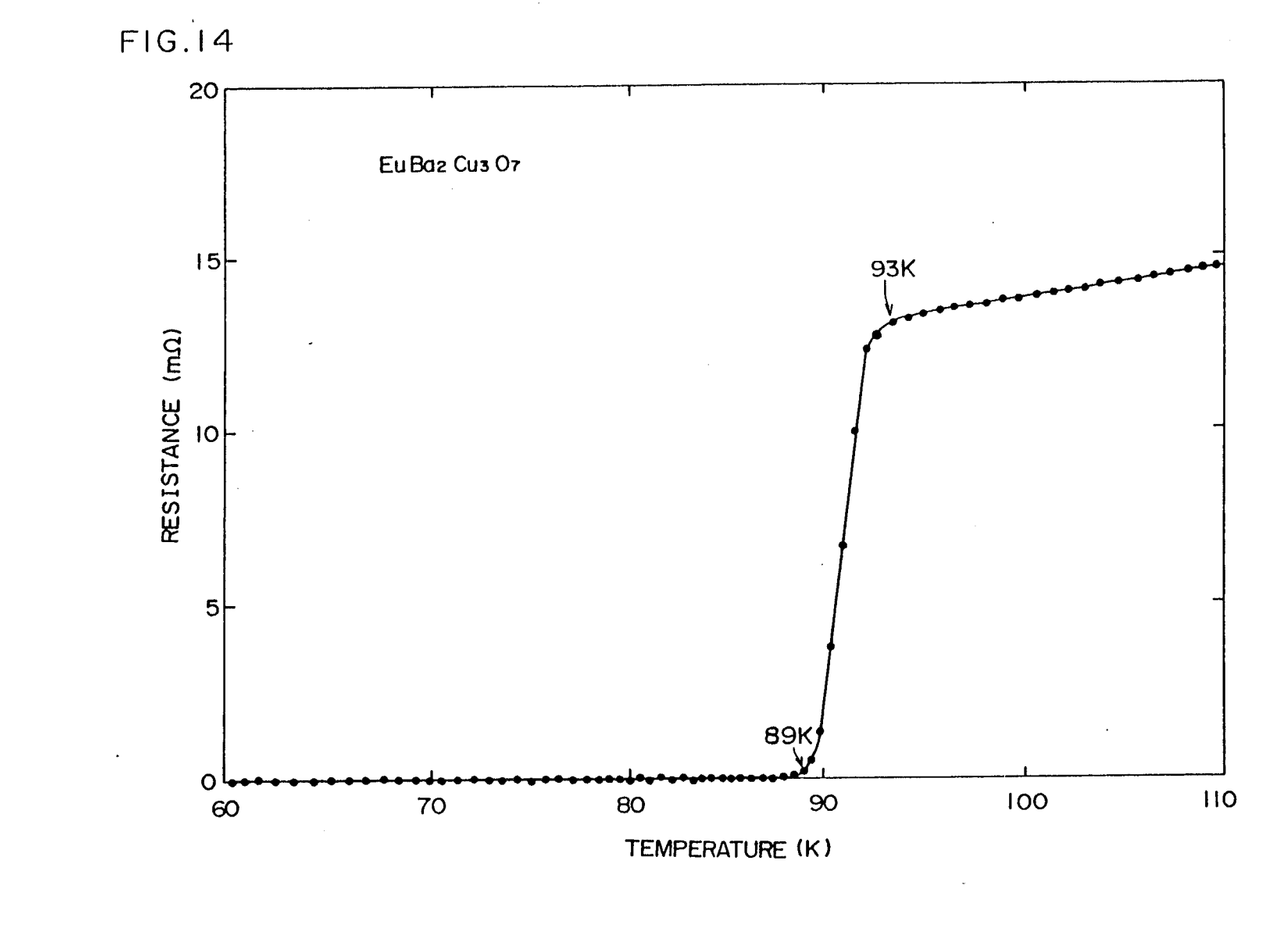
Figure 15:
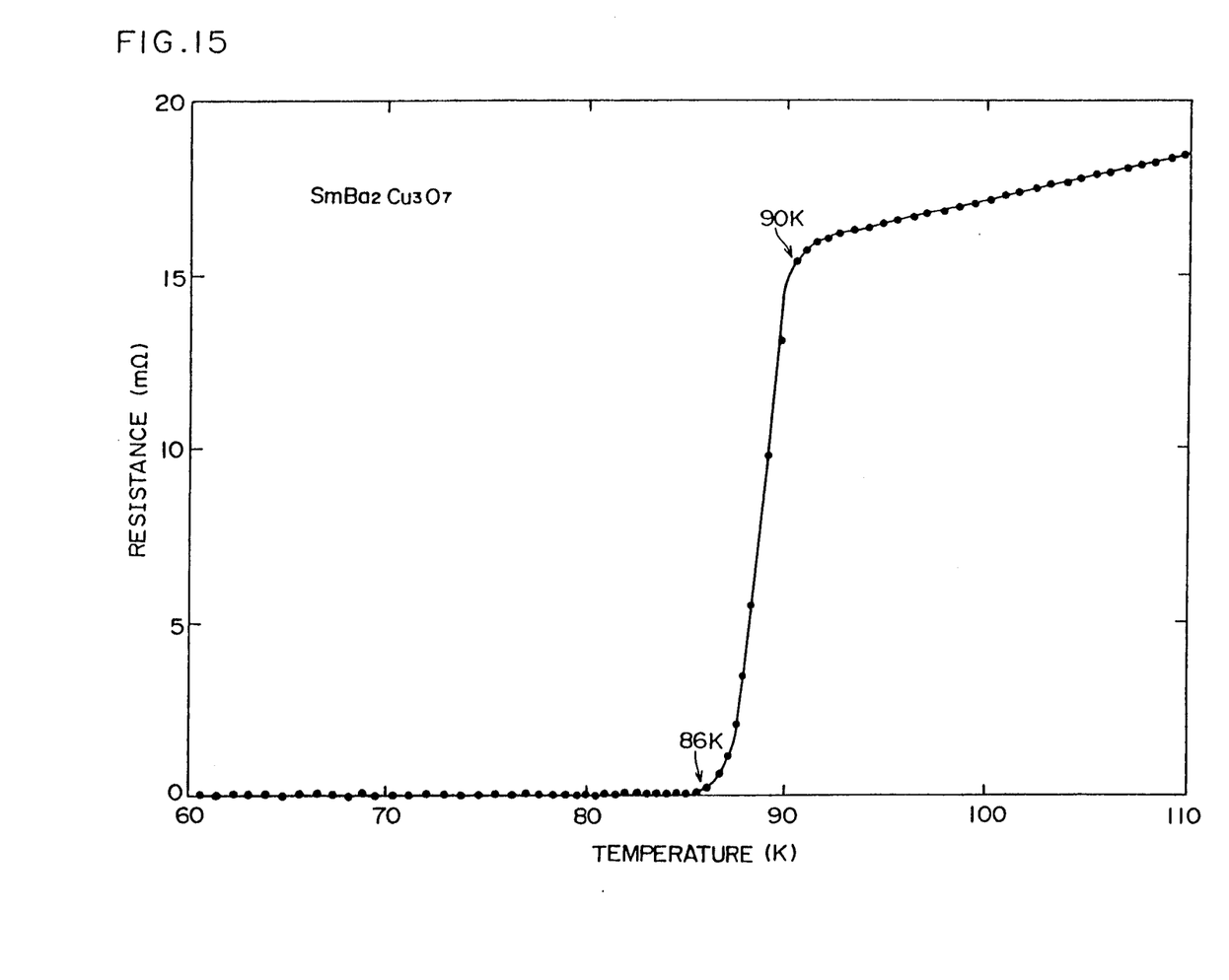
Figure 16:
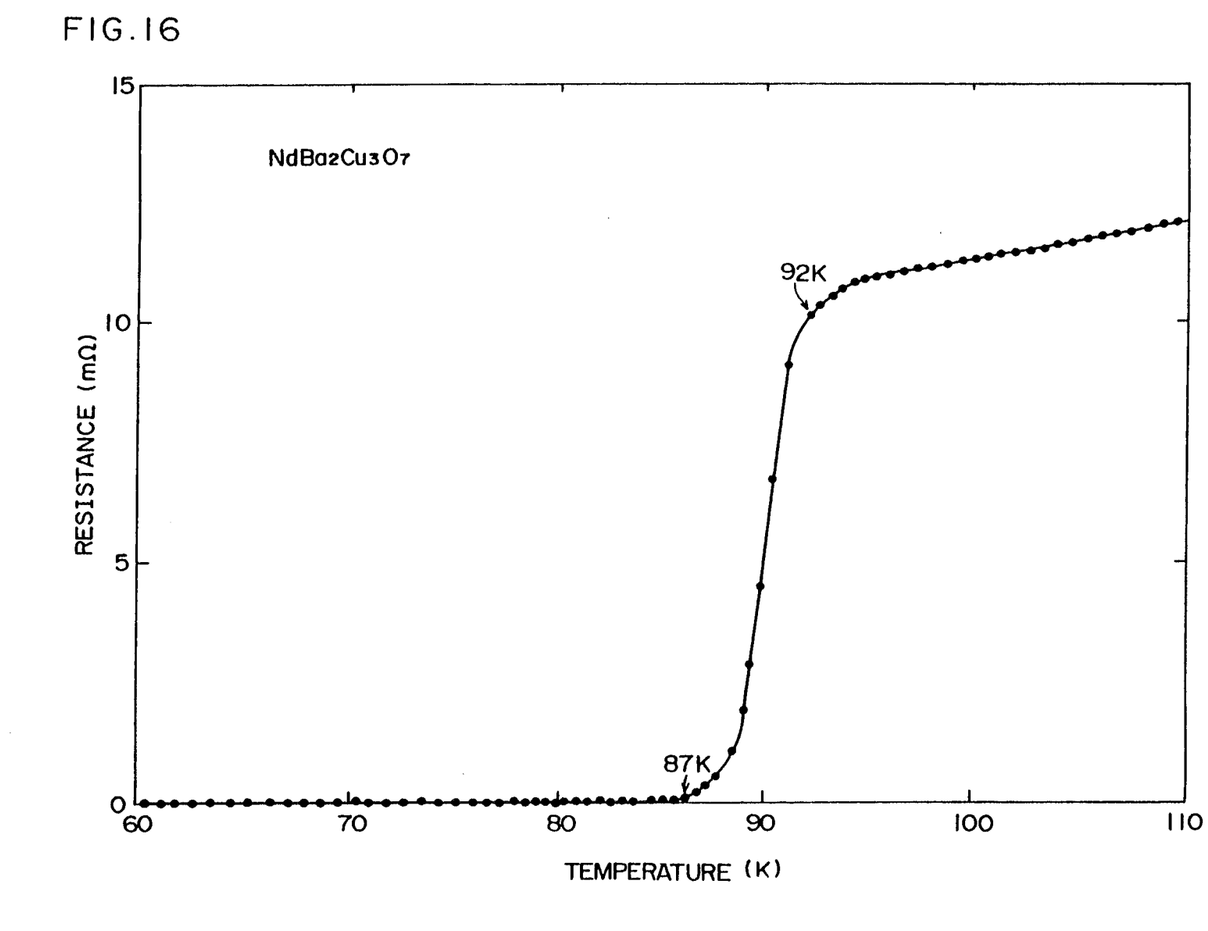

FIGS. 6 to 8 are diagrams describing a measurement of a critical current of $YBa_2Cu_3O_7$. A sample 1 of $17 \times 4.5 \times 1.8$ mm is provided with four terminals (2), (3), (4), (5), as shown in FIG. 6 (plan view) and FIG. 7 (sectional view). Of these four terminals, both end terminals (2), (5) are surrounded, extending a width of 3 mm, by a naked copper wire having a diameter of 0.1 mm arranged in a stuck manner and a silver paste is placed on a surface of the copper wire followed by winding a thick copper wire around the silver paste and soldering. In addition, the inner two terminals (3), (4) are surrounded by a naked copper wire having a diameter of 0.1 mm at intervals of 3 mm and the wound copper wire is fixed by a silver paste.

And, the sample (1) provided with four terminals in the above described manner was immersed in liquid nitrogen (7) of 77K, as shown in FIG. 8, to measure the critical current $J_c$ (A/cm$^2$). Concretely speaking, the critical current $J_c$ (A/cm$^2$) is measured from a value of voltage brought about when the sintered compound (1) is electrified through both end terminals (2), (5) and the inner two terminals (3), (4) are connected to a voltmeter (6). In addition, in this measurement system a value of current, at which the voltage amounted to 2.5 micro V/cm, was selected as the critical current.

As a result, it was confirmed that a current of 8.2 A or 101.2 A/cm$^2$ flew through the sintered compound (1).

FIGS. 9 to 16 are diagrams showing electric resistance-temperature characteristics of $YbBa_2Cu_3O_7$, $ErBa_2Cu_3O_7$, $GdBa_2Cu_3O_7$, $DyBa_2Cu_3O_7$, $HoBa_2Cu_3O_7$, $EuBa_2Cu_3O_7$, $SmBa_2Cu_3O_7$ and $NdBa_2Cu_3O_7$, respectively.

$T_{co}$ and $T_{ci}$ of these compounds are as follows (unit: K).

|  | $T_{co}$ | $T_{ci}$ |
| --- | --- | --- |
| $YbBa_2Cu_3O_7$ | 90 | 81 |
| $ErBa_2Cu_3O_7$ | 90 | 87 |
| $GdBa_2Cu_3O_7$ | 95 | 93 |
| $DyBa_2Cu_3O_7$ | 93 | 90 |
| $HoBa_2Cu_3O_7$ | 90 | 85 |
| $EuBa_2Cu_3O_7$ | 93 | 89 |
| $SmBa_2Cu_3O_7$ | 90 | 86 |
| $NdBa_2Cu_3O_7$ | 92 | 87 |

The above described substances according to the present invention all have the critical temperature of 90 K or more. Accordingly, they can be maintained under the superconducting state by the use of inexpensive liquid nitrogen having a boiling point of 77 K.

In addition, of $Y_{0.4}Ba_{0.6}CuO_3$, the third and fourth substances, $YBa_2Cu_3O_7$ and (lanthanoid) $Ba_2Cu_3O_7$ have $T_{co}$ and $T_{ci}$ which are remarkable close to each other. Accordingly, they hardly contain an instabilized range in which the electric resistance is rapidly changed with a change of temperature. Accordingly, they are remarkably advantageous in the use thereof.

In addition, the method of producing them does not include any specially difficult process.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A method of producing a superconducting material having a composition expressed by an empirical formula $Y_{1-x}Ba_xCuO_3$, comprising the steps of blending $Y_2O_3$, $BaCO_3$ and $CuO$ into a mixture with a nominal molar ratio 0.2:0.6:1, molding the mixture under pressure, thereafter sintering the molded mixture in an oxidizing atmosphere and then cooling the sintered mixture at a rate of not greater than 100° C./hour in an oxidizing atmosphere.

2. A method of producing a superconducting material as set forth in claim (1) wherein the sintering step is carried out at a temperature of about 1,000° C. for about 1 hour.

3. A method of producing a superconducting material as set forth in claim (1) wherein the sintering step is carried at a temperature of about 920° C. for about 1 hour.

4. A method of producing a superconducting material as set forth in claim (1) wherein said cooling step is carried out at a rate of about 10° C./hour.

5. A method of producing a superconducting material having a composition expressed by an empirical formula $YBa_2Cu_3O_7$, comprising blending $Y_2O_3$, $BaCO_3$ and $CuO$ into a mixture having a nominal mixture molar ratio 1:4:6, molding the mixture under pressure, sintering the molded mixture in an oxidizing atmosphere, and then slowing cooling the sintered molded mixture at a rate of about 50° C./hour or less in an oxidizing atmosphere.

6. A method of producing a superconducting material as set forth in claim (5) wherein said sintering step is carried out at a temperature of about 1,000° C. for about 1 hour.

7. A method of producing a superconducting material having a composition expressed by an empirical formula $YBa_2Cu_3O_7$ through which a current of 100 $A/cm^2$ or more flows at about 77° K., comprising the steps of blending $Y_2O_3$, $BaCO_3$ and $CuO$ into a mixture having a nominal mixture molar ratio of 1:4:6, molding the mixture under pressure, sintering the molded mixture in an oxidizing atmosphere, and cooling the molded sintered mixture in an oxidizing atmosphere at a rate of about 50° C./hour or less.

8. A method of producing a superconducting material as set forth in claim (7), wherein said sintering step is carried out at a temperature of about 1,000° C. for about 1 hour.

9. A method of producing a superconducting material having a composition expressed by an empirical formula $GdBa_2Cu_3O_7$, comprising the steps of blending $Gd_2O_3$, $BaCO_3$ and $CuO$ into a mixture having a nominal mixture molar ratio of 1:4:6, molding the resulting mixture under pressure, sintering the molded mixture in an oxidizing atmosphere, and cooling the molded sintered mixture in an oxidizing atmosphere at a rate of not more than 50° C./hour.

10. A method of producing a superconducting material as set forth in claim (9), wherein said oxidizing atmosphere is air.

11. A method of producing a superconducting material as set forth in claim (9), wherein said sintering step is carried out at a temperature of about 1,000° C. for about 1 hour.

12. A method of producing a superconducting material having a composition expressed by an empirical formula $ErBa_2Cu_3O_7$, comprising the steps of blending $Er_2CO_3$, $BaCO_3$ and $CuO$ with the mixture having a nominal mixture molar ratio of 1:4:6, molding the resulting mixture under pressure, sintering the molded mixture in an oxidizing atmosphere, and cooling the sintered molded mixture at a rate of 150° C./hour or less in an oxidizing atmosphere.

13. A method of producing a superconducting material as set forth in claim (12), wherein said oxidizing atmosphere is oxygen.

14. A method of producing a superconducting material as set forth in claim (12) wherein the sintering step is carried out at a temperature of about 1,000° C. for about 1 hour followed by 800° C. and about three hours.

15. A method of producing a superconducting material having a composition expressed by an empirical formula $YbBa_2Cu_3O_7$, comprising the steps of blending $Yb_2O_3$, $BaCO_3$ and $CuO$ into a mixture whose nominal mixture molar ratio is 1:4:6, molding the resulting mixture under pressure, sintering the molded mixture in an oxidizing atmosphere, and cooling the sintered molded mixture at a rate of 50° C./hour or less in an oxidizing atmosphere.

16. A method of producing a superconducting material as set forth in claim (15), wherein said oxidizing atmosphere is air.

17. A method of producing a superconducting material as set forth in claim (15), wherein said sintering step is carried out at a temperature of about 1,050° C. for about 1 hour.

* * * * *